United States Patent
Yamada et al.

(10) Patent No.: US 8,299,816 B2
(45) Date of Patent: Oct. 30, 2012

(54) DATA PROCESSING APPARATUS

(75) Inventors: Kazuo Yamada, Kanagawa (JP); Takao Naito, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 100 days.

(21) Appl. No.: 12/891,352

(22) Filed: Sep. 27, 2010

(65) Prior Publication Data

US 2011/0225415 A1 Sep. 15, 2011

(30) Foreign Application Priority Data

Mar. 11, 2010 (JP) ................................. 2010-54133

(51) Int. Cl.
*H03K 19/173* (2006.01)
*G06F 15/00* (2006.01)

(52) U.S. Cl. .............. 326/46; 326/38; 326/41; 712/226; 712/520

(58) Field of Classification Search .............. 712/226, 712/520, 34, 15, 16; 326/38–41, 46
See application file for complete search history.

(56) References Cited

U.S. PATENT DOCUMENTS

| 7,157,934 B2 * | 1/2007 | Teifel et al. ...................... 326/38 |
| 7,418,579 B2 * | 8/2008 | Guibert et al. ................ 712/226 |
| 7,474,119 B2 | 1/2009 | Kanno et al. |
| 7,595,659 B2 * | 9/2009 | Vorbach et al. ................. 326/39 |
| 7,765,383 B2 * | 7/2010 | Zhang .............................. 712/34 |
| 8,058,899 B2 * | 11/2011 | Vorbach et al. ................. 326/39 |
| 2006/0218424 A1 * | 9/2006 | Abramovici et al. ......... 713/323 |
| 2009/0158293 A1 | 6/2009 | Kajihara |

FOREIGN PATENT DOCUMENTS

| JP | A-2000-252814 | 9/2000 |
| JP | A-2001-320271 | 11/2001 |
| JP | A-2005-124130 | 5/2005 |
| WO | A1-WO2007/029421 | 3/2007 |
| WO | WO 2007/029421 A1 | 3/2007 |

* cited by examiner

*Primary Examiner* — Vibol Tan
(74) *Attorney, Agent, or Firm* — Oliff & Berridge, PLC

(57) ABSTRACT

A data processing apparatus includes a reconfigurable circuit capable of reconfigurating partially a circuit configuration: and a reconfiguration controlling unit that controls a reconfiguration of the circuit configuration of the reconfigurable circuit. The reconfiguration controlling unit reconfigurates a plurality of partial circuits, which constitute one pipeline and are reconfigurated simultaneously on the reconfigurable circuit, on the reconfigurable circuit in sequence from a head partial circuit of the pipeline, and starts sequentially the reconfigurated partial circuits from a head.

5 Claims, 13 Drawing Sheets

FIG. 11A

| ts1 | ts2 | ts3 | ts4 | ts5 | ts6 | ts7 | ts8 | ts9 | ts10 | ts11 | ts12 |
|---|---|---|---|---|---|---|---|---|---|---|---|
| UNDER RECONFIGURATION | | | BLOCK C OF THE CIRCUIT α | BLOCK C OF THE CIRCUIT α | BLOCK C OF THE CIRCUIT α | UNDER RECONFIGURATION | | | BLOCK C OF THE CIRCUIT β | BLOCK C OF THE CIRCUIT β | BLOCK C OF THE CIRCUIT β |
| UNDER RECONFIGURATION | | | BLOCK B OF THE CIRCUIT α | BLOCK B OF THE CIRCUIT α | BLOCK B OF THE CIRCUIT α | UNDER RECONFIGURATION | | | BLOCK B OF THE CIRCUIT β | BLOCK B OF THE CIRCUIT β | BLOCK B OF THE CIRCUIT β |
| UNDER RECONFIGURATION | | | BLOCK A OF THE CIRCUIT α | BLOCK A OF THE CIRCUIT α | BLOCK A OF THE CIRCUIT α | UNDER RECONFIGURATION | | | BLOCK A OF THE CIRCUIT β | BLOCK A OF THE CIRCUIT β | BLOCK A OF THE CIRCUIT β |

FIG. 11B

| ts1 | ts2 | ts3 | ts4 | ts5 | ts6 | ts7 | ts8 | ts9 | ts10 | ts11 | ts12 |
|---|---|---|---|---|---|---|---|---|---|---|---|
| | | UNDER RECONFIGU-RATION | BLOCK C OF THE CIRCUIT α | BLOCK C OF THE CIRCUIT α | BLOCK C OF THE CIRCUIT α | UNDER RECONFIGU-RATION | BLOCK C OF THE CIRCUIT β | BLOCK C OF THE CIRCUIT β | BLOCK C OF THE CIRCUIT β | | |
| | UNDER RECONFIGU-RATION | BLOCK B OF THE CIRCUIT α | BLOCK B OF THE CIRCUIT α | BLOCK B OF THE CIRCUIT α | UNDER RECONFIGU-RATION | BLOCK B OF THE CIRCUIT β | BLOCK B OF THE CIRCUIT β | BLOCK B OF THE CIRCUIT β | | | |
| UNDER RECONFIGU-RATION | BLOCK A OF THE CIRCUIT α | BLOCK A OF THE CIRCUIT α | BLOCK A OF THE CIRCUIT α | UNDER RECONFIGU-RATION | BLOCK A OF THE CIRCUIT β | BLOCK A OF THE CIRCUIT β | BLOCK A OF THE CIRCUIT β | | | | | ously on the FPGA to execute a
DATA PROCESSING APPARATUS

CROSS-REFERENCE TO RELATED APPLICATION

This application is based on and claims priority under 35 USC 119 from Japanese Patent Application No. 2010-054133 filed on Mar. 11, 2010.

BACKGROUND

1. Technical Field

The present invention relates to a data processing apparatus.

2. Related Art

The reconfigurable circuit (called also the "programmable logic circuit") such as PLD (Programmable Logic Device), FPGA (Field Programmable Gate Array), or the like, whose internal configuration of logical circuits is changeable, is spreading. As PLD or FPGA, the device whose internal configuration of logical circuits is set upon starting the circuit is common, but the device whose circuit configuration of logical circuits is changeable in operation has also been developed.

In this case, even though the circuit configuration is changeable in operation, a time required for a change (rewriting) of the circuit configuration is vastly long in comparison with the Dynamically Reconfigurable Processor (DRP) that has been developed while focusing on the dynamic change of the circuit configuration. Therefore, the technology to reduce a rewriting time of the circuit configuration has been proposed in the related art.

SUMMARY

According to an aspect of the invention, a data processing apparatus includes a reconfigurable circuit capable of reconfigurating partially a circuit configuration: and a reconfiguration controlling unit that controls a reconfiguration of the circuit configuration of the reconfigurable circuit, wherein the reconfiguration controlling unit reconfigurates a plurality of partial circuits, which constitute one pipeline and are reconfigurated simultaneously on the reconfigurable circuit, on the reconfigurable circuit in sequence from a head partial circuit of the pipeline, and starts sequentially the reconfigurated partial circuits from a head.

BRIEF DESCRIPTION OF THE DRAWINGS

Exemplary embodiments of the invention will be described in detail based on the following figures, wherein:

FIG. 11A is a time chart explaining a flow when two whole circuits are written into the FPGA under reconfiguration control in the related art;

FIG. 11B is a time chart explaining a flow when two whole circuits are written into the FPGA under reconfiguration control of the exemplary embodiment;

DETAILED DESCRIPTION

Figure 1:
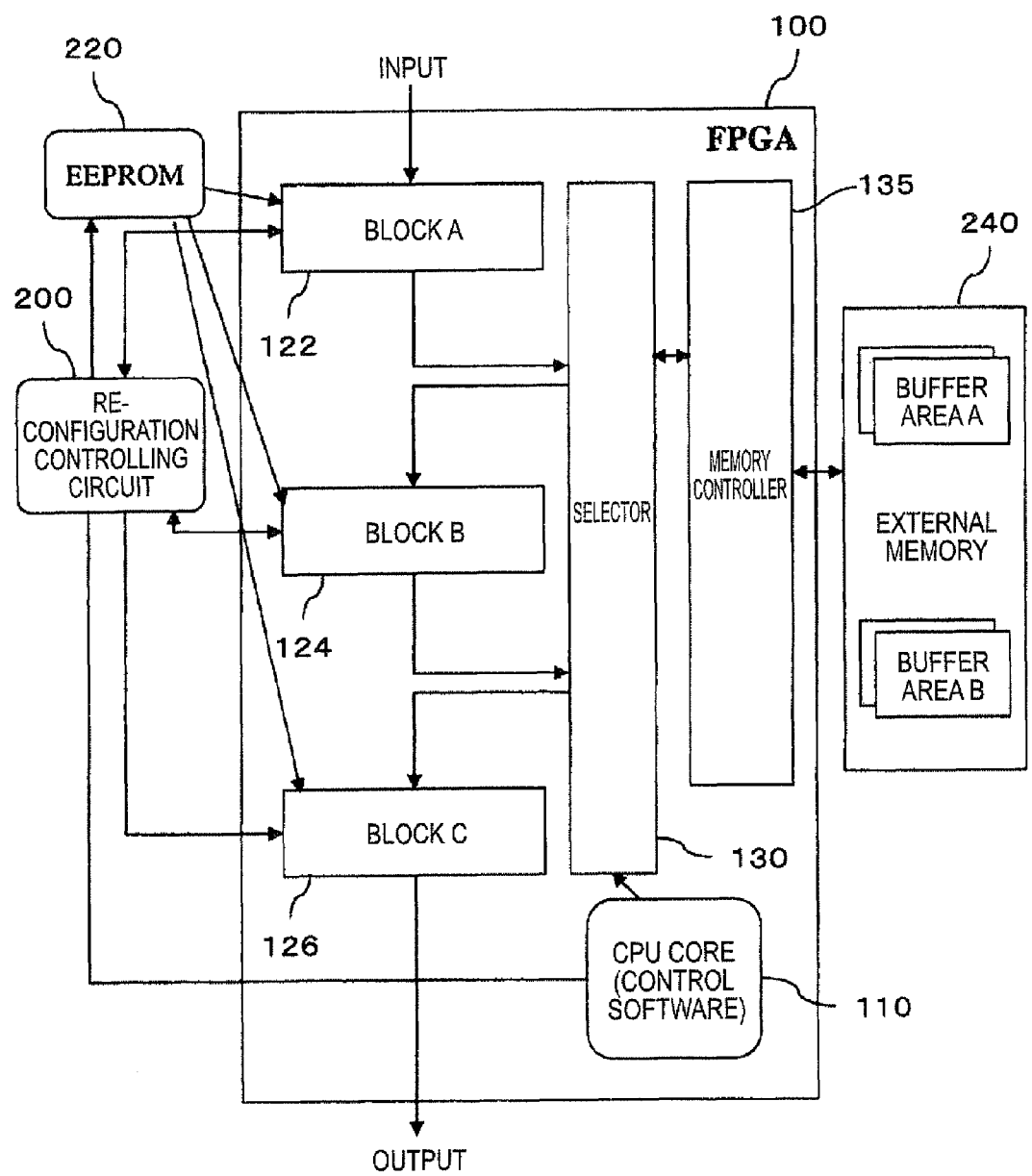
FIG. 1 is a view showing an example of a configuration of a data processing apparatus of an exemplary embodiment of the present invention.

FIG. 1 is a view showing an example of a configuration of a data processing apparatus of an exemplary embodiment of the present invention. In this example, the data processing apparatus includes a FPGA 100 as an example of the reconfigurable circuit, and also includes a reconfiguration controlling circuit 200, an EPROM (Electrically Erasable Programmable Read Only Memory) 220, and an external memory 240.

In this example, the FPGA 100 is equipped with a CPU (Central Processing Unit) core (control software) 110. This CPU core 110 executes a control software to control respective units such as the FPGA 100, the reconfiguration controlling circuit 200, and the like of this data processing apparatus. The CPU core 110 may be incorporated into the FPGA 100 as a dedicated hard circuit block or may be constructed by combining logical blocks and wiring resources provided to the FPGA 100 together. The provision of the CPU core 110 into the FPGA 100 is given merely by way of example that, and alternately the CPU may be of course provided on the outside of the FPGA 100.

Also, the FPGA 100 is of the dynamically rewritable and partially rewritable type. That is, while a circuit that is reconfigurated on a part of FPGA 100 is operating, the FPGA 100 may reconfigurate another circuit in another part that does not overlaps the part that the circuit occupies. Even though the "dynamically" is used in this FPGA, this FPGA needs a vastly longer time than the DPR, which is specialized in the dynamic reconfiguration use, upon rewriting (reconfigurating) the circuit elements to read the circuit configuration data, and the like.

A block A 122, a block B 124, a block C 126 in the FPGA 100 correspond to the circuits that are reconfigured by employing a group of logic blocks and the wiring resources in the FPGA 100 respectively. The block A 122, the block B 124, the block C 126 may be allocated (present) simultaneously on the FPGA 100 and constitute a pipeline in this order. That is, these blocks have such a relation that an output of the block A 122 constitutes an input of the block B 124, and an output of the block B 124 constitutes an input of the block C 126. In this example, input data is input into the block A from the external device and processed, then the processed result is processed by the block B, and finally the processed result is processed by the block C and output to the external device. That is, when viewed from the external device, one circuit consisting of the blocks A, B, C functions as the circuit that executes the data processing that the concerned external device requested.

Figure 2:
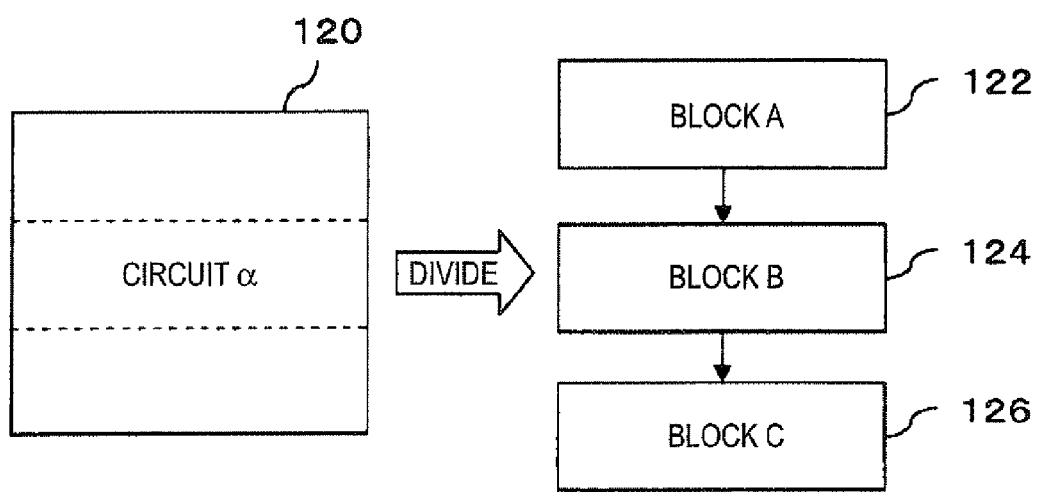
FIG. 2 is a view explaining such a situation that one circuit is divided into a plurality of blocks (partial circuits) constituting a pipeline.

Therefore, as shown in FIG. 2, the block A 122, the block B 124, and the block C 126 may be grasped such that one circuit α 120 that is simultaneously reconfigurable on the FPGA 100 is divided into three partial circuits constituting a pipeline. Here, the "simultaneously reconfigurable on the FPGA 100" circuit (or a plurality of circuits) denotes the circuit (or a plurality of circuits) whose size may be housed at a time on the FPGA 100 (i.e., which may be provided simultaneously and be operated) unless the configuration of the FPGA 100 is rewritten. In the following, it is assumed that, in order to clarify the distinction from the blocks A, B, C as the partial circuits, the original circuit α before the division is called the whole circuit α.

In respective examples in the specification starting with FIG. 1, the example where one circuit is divided into three blocks A, B, C is explained. This case is given merely by way of example. The scheme of this exemplary embodiment is applicable to even the case where one circuit is divided into two blocks or four blocks or more.

Also, as the original whole circuit α that is divided into the block group constituting a pipeline, an overall circuit that is present simultaneously on the FPGA 100 and operates may be employed or a part of such overall circuit may be employed. For example, the latter corresponds to the case where, while the FPGA 100 is dynamically and partially reconfigurated by the system of the related art, one circuit that is partially reconfigurated is grasped as the whole circuit α and then such one circuit is divided into a plurality of blocks constituting a pipeline.

Here, a feature of the control in this exemplary embodiment explained subsequently does not depend on the concrete circuit configuration and processed contents of respective blocks A, B, C. Any blocks may be employed as the blocks A, B, C if such blocks are reconfigurable simultaneously on the FPGA 100 and may constitute a pipeline to apply the processing to the data from the external device.

In the example in FIG. 1, the blocks A, B, C transfer sequentially the data via the external memory 240 to embody the pipeline process. That is, the block A processes the input data from the external device, and writes the processed result into a buffer area A that is previously defined in the external memory 240. The block B reads the data of the processed result in the block A from the buffer area A of the external memory 240, then applies the processing to the data, and then writes the processed result into a buffer area B that is previously defined in the external memory 240 and is different from the buffer area A. The block C receives the data of the processed result in the block B from the buffer area B of the external memory 240, then applies the processing to the data, and then outputs the processed result to the external device. In this case, the buffer area A may be formed as the double buffer structure such that the writing of the data from the block A and the reading of the data from the block A may be executed in parallel. This is similarly true of the buffer area B.

In order to control the inputting/outputting operations of the blocks A, B, C into/from the external memory 240, the FPGA 100 has a selector 130 and a memory controller 135. The output of the block A 122, the input and output of the block B, and the input of the block C 126 are connected to the selector 130. The selector 130 mediates a contention about the access requests issued from the blocks A, B, C to the external memory 240. The memory controller 135 controls the reading/writing of the blocks A, B, C from/into the external memory 240 via the selector 130.

The selector 130 and the memory controller 135 may be incorporated into the FPGA 100 as a hardware circuit, or may be constructed by using the logic blocks and the wiring resources of the FPGA 100.

The external memory 240 is a memory provided on the outside of the FPGA 100, and RAM is provided, for example. The external memory 240 may be connected directly to the FPGA 100, or may be connected a bus to which the FPGA 100 is connected. In the latter case, the external memory 240 may also be accessed by the devices on the bus other than the FPGA 100. In the example in FIG. 1, as described above, the external memory 240 is used as a temporary memory to transfer the data between the blocks A, B, C.

In case an amount of data that are transferred between the blocks A, B, C is relatively small, the buffer circuit for storing temporarily these data may be built or constructed in the FPGA 100, instead of the provision of the external memory 240. In the following, in order to avoid complicatedness, only the case where the external memory 240 is utilized will be explained hereinafter.

Circuit information (configuration data) indicating the circuit structures (configurations) that are reconfigurated on the FPGA 100 are held in the EEPROM 220. In case a plurality of configurations are constructed sequentially on the FPGA 100 and are operated, the circuit information of respective configurations (and information indicating a sequence of respective configurations), etc. are stored in the EEPROM 220. In the example in FIG. 1, the circuit information may be stored in the EEPROM 220 in unit of the partial circuit such as the block A, B, or C. Also, the information about wiring definitions and auxiliary circuits required to construct a pipeline between respective blocks may be stored in the EEPROM 220.

In this case, the EEPROM 220 is illustrated as the memory device for holding the circuit information herein. But this is given merely an example. The nonvolatile memory of other type (e.g., ROM or a hard disc) may be of course employed. Also, the memory of the type that causes SRAM (Static Random Access Memory) to hold the circuit information therein may be employed as the FPGA 100.

The reconfiguration controlling circuit 200 combines the logical circuit groups and the wiring resources in the FPGA 100 mutually in compliance with the circuit information held in the EEPROM 220. Thus, the reconfiguration controlling circuit 200 reconfigurates the circuits in the FPGA 100 in response to the circuit information.

Figure 3:
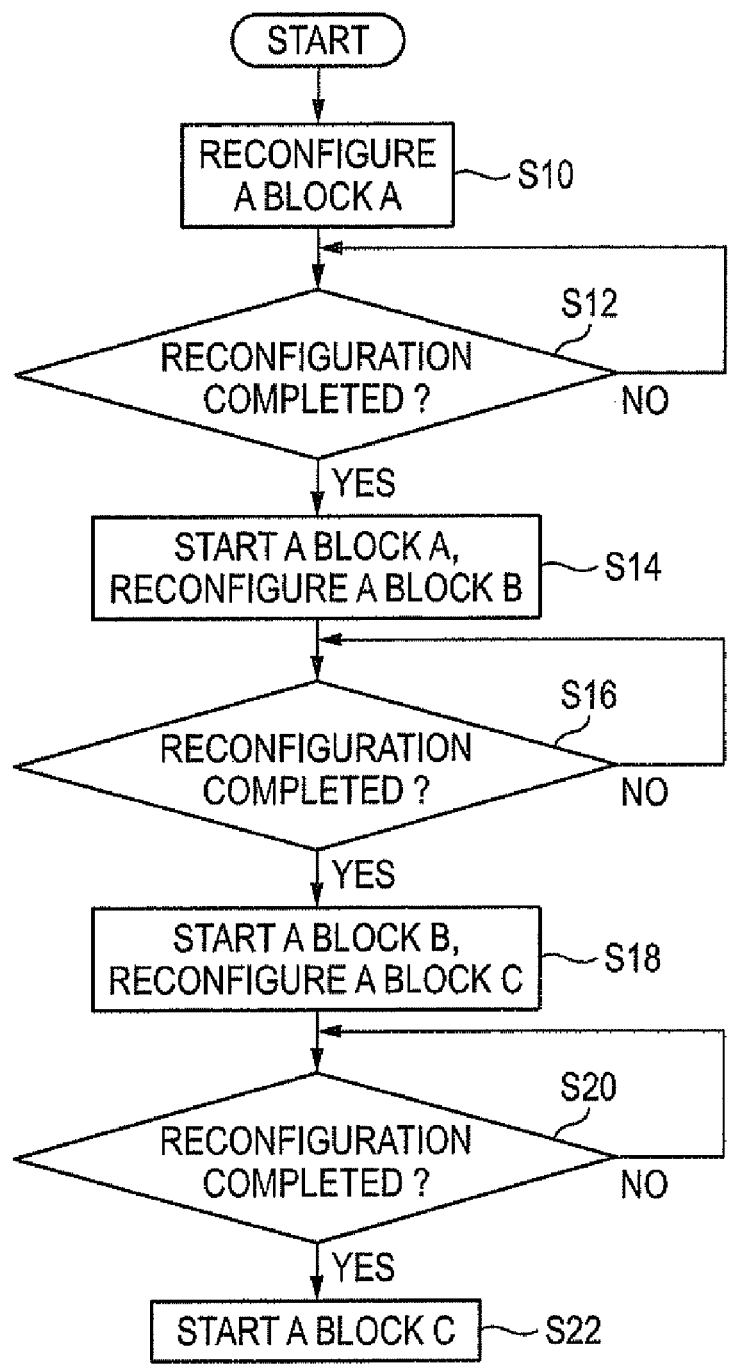
FIG. 3 is a view showing an example of controlling procedures that a reconfiguration controlling circuit of the exemplary embodiment executes.

Here, since the blocks A, B, C shown in FIG. 1 may be allocated simultaneously on the FPGA 100, the reconfiguration controlling circuit in the related art reconfigurates these blocks collectively at a time. In contrast, the reconfiguration controlling circuit 200 of the present exemplary embodiment reconfigurates respective blocks in sequence of the pipeline. An example of procedures in this reconfiguration is shown in FIG. 3. The reconfiguration controlling circuit 200 starts the procedures in FIG. 3 automatically after this circuit is started by turning ON a power, or when this circuit receives the command to start the reconfiguration from the CPU core 110, for example.

In the procedures in FIG. 3, first the reconfiguration controlling circuit 200 reconfigures the block A on the FPGA 100, reading the circuit information of the block A as the head of the pipeline from the EEPROM 220 and then writing the read circuit information into the FPGA 100 (S10). At this time, the reconfiguration controlling circuit 200 also reconfigures simultaneously the wiring, which connects the input of the block A to the data input from the external device, and the wiring, which connects the output of the block A to the selector 130. Then, the reconfiguration controlling circuit 200 stands by until the reconfiguration of the block A and accompanying wirings is completed (S12). If this reconfiguration is completed, the reconfiguration controlling circuit 200 starts the processing of the input data by starting the block A, and also reconfigures the block B and accompanying wirings (i.e., respective wirings for inputting and outputting the data between the selector 130 and the block 13) on the FPGA 100 in compliance with the circuit information in the EEPROM 220 (S14). That is, in the present exemplary embodiment, the operation of the block A and the reconfiguration of the block B are executed concurrently. The started block A receives the data input from the external device and executes the processing. The processed result of the block A is written into the buffer area A of the external device 240 via the selector 130 and the memory controller 135.

Then, the reconfiguration controlling circuit 200 stands by until the reconfiguration of the block B and accompanying wirings is completed (S16). The reconfiguration controlling circuit 200, when informed of the completion of this reconfiguration, starts the processing of the input data by starting the block B, and also reconfigures the block C and accompanying wirings (i.e., respective wirings for inputting and outputting the data between the selector 130 and the block C) on the FPGA 100 in compliance with the circuit information in the EEPROM 220 (S18). Accordingly, the blocks A and B operate on the FPGA 100, and the block C is reconfigurated in parallel with these operations. The started block B reads the data of the processed result of the block A stored in the buffer area A of the external memory 240 via the selector 130, and applies the processing to the read data. Then, the block B writes the data of the processed result into the buffer area B of the external memory 240 via the selector 130.

Then, the reconfiguration controlling circuit 200 stands by until the reconfiguration of the block C and accompanying wirings is completed (S20). If the reconfiguration is completed, the reconfiguration controlling circuit 200 starts the processing of the input data by starting the block C (S22). As a result, all blocks A, B, C are operated. The started block C reads the data of the processed result of the block B stored in the buffer area 13 of the external memory 240 via the selector 130, and applies the processing to the read data. Then, the block C outputs the data of the processed result to the external device.

Subsequently, the blocks A, B, C performs the pipeline operation while transferring the data via the external memory 240 until the next rewriting (reconfiguration) is started. Accordingly, the FPGA 100 is viewed from the outside as if this FPGA 100 performs the similar operation to the circuit α 120 shown in FIG. 2.

As described above, since the blocks A, B, C constituting the pipeline are reconfigured in order from the head and are started, the processing may be accelerated, particularly the outputting of the first processes result may be sped up, rather than the case where these blocks A, B, C are reconfigured collectively at the same time and are started. Thus, this effect will be explained with reference to FIG. 4 hereunder.

Figure 4:
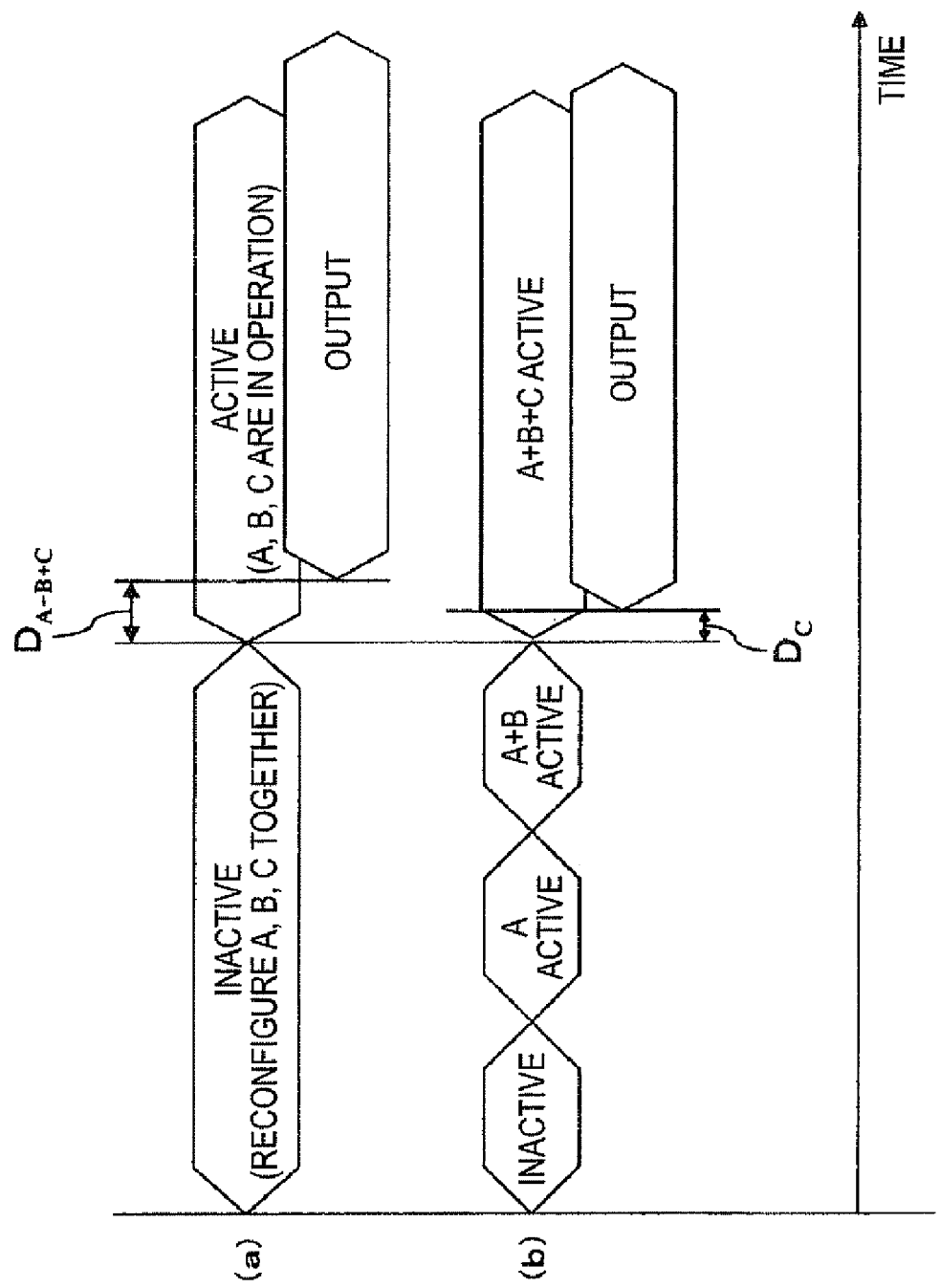
FIG. 4 is a view showing a time chart showing a change of a state of an FPGA in reconfiguration control in the related art and the exemplary embodiment respectively.

In FIG. 4, a time chart representing a transition of a state of the FPGA 100 in time is illustrated, wherein a chart (a) shows the "collective reconfiguration" system in the related art, and a chart (b) shows the "sequential reconfiguration" system in the present exemplary embodiment.

As shown in the chart (a) of FIG. 4, in the system in the related art, the whole circuit α consisting of the blocks A, B, C is reconfigurated collectively on the FPGA 100. Therefore, an area, which is to be occupied by the whole circuit α, of the FPGA 100 is set in an inactive (non-operation) state during a time required for the reconfiguration. This time required for the reconfiguration is substantially proportional to a circuit scale of the whole circuit α, in other words, an amount of data of the circuit information representing the whole circuit α. Then, when the reconfiguration of the whole circuit α, i.e., all blocks A, B, C is completed, the whole circuit α goes to an active (operation) state, and starts the processing of the input data from the external device. Here, because of a delay in circuit, a delay time $D_{A+B+C}$ is needed until the first processed result is output after the whole circuit α starts the processing. For example, when the whole circuit α corresponds to the circuit that executes the image processing, a line delay of a line memory contained in the whole circuit α constitutes one cause of the delay time. Because the blocks A, B, C constitute the pipeline, a delay time of the whole circuit α becomes substantially equal to a total sum of delay times $D_A$, $D_B$, $D_C$ of individual blocks A, B, C.

In contrast, as shown in the chart (b) of FIG. 4, in the system in the present exemplary embodiment, an area, which is to be occupied by the whole circuit α, of the FPGA 100 is set in an inactive state merely during a while in which the reconfiguration controlling circuit 200 reconfigurates the block A after the reconfiguration control is started. When the reconfiguration of the block A is completed, the block B goes to an active state and the reconfiguration of the block B is executed in parallel with this. When the reconfiguration of the block B is also completed, the blocks A and B go to an active state and the reconfiguration of the block C is executed in parallel with this. Then, when the reconfiguration of the block C is also completed, all blocks go to an active state. Since a time required for the reconfiguration in the FPGA 100 is in proportion to a circuit scale, a time required until all blocks A, B, C go to an active state after the reconfiguration of the block A is started is substantially equal to a time required to reconfigurate the whole circuit α in the system in the related art.

Here, in the system in the present exemplary embodiment, the processing of the data being input at first is completed in the blocks A, B at a point of time when all blocks A, B, C go to an active state, and therefore the block C may receive the processed result of the block B that already exists on the buffer area 13 and start the processing. Accordingly, a delay required until the first processed result is output from a point of time when all blocks A, B, C go to an active state is reduced substantially only to a delay time $D_C$ of the block C. That is, in contrast to the system in the related art, the start of the outputting of the processed result is accelerated by a delay time caused by the blocks A, B, and in turn a time required until the outputting of the processed result of all input data is completed is sped up.

Now, when the data processing apparatus in FIG. 1 is caused to execute the image processing for the page printing, for example, the block A whose reconfiguration is completed executes the processing of the image data in a band area with a certain width within a reconfiguration time, in which the block A may process the image, from the head of the page during a time required for the reconfiguration of the block B (referred to as a "reconfiguration time" hereinafter). This band area is called a "band". The band has a full width of the page along the main scanning direction in the lateral direction, and has a width according to an amount of data that the block may process during the reconfiguration time in the longitudinal direction. In the example in FIG. 5, the block A executes the processing in a band B1 during the reconfiguration time of the block B, and competes such processing.

Figure 5:
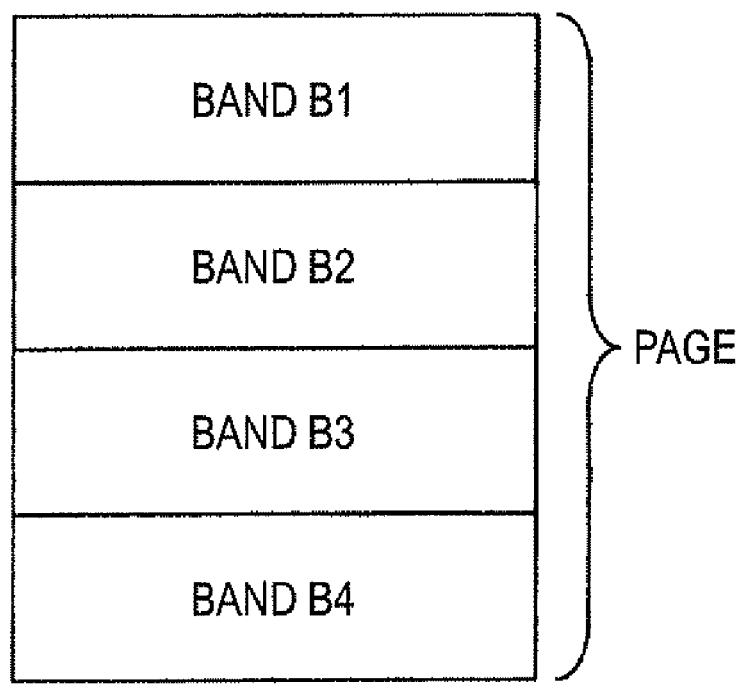
FIG. 5 is a view showing an example of a band division of an image.

Here, as described above, a time required for the reconfiguration in the FPGA 100 is substantially proportional to a scale of the reconfigurated circuit, in other words, an amount of data of the circuit information being read for the reconfiguration. Accordingly, in the example in FIG. 1, if it is assumed that the circuit scales of the blocks A, B, C are substantially equal to each other, the reconfiguration times of respective blocks substantially become equal mutually. Also, it is considered that a time required until a certain block processes a predetermined amount of data (referred to as a "data processing time" hereinafter) is substantially proportional to the circuit scale. Therefore, it may be considered that the data processing times of respective blocks A, B, C are substantially equal mutually. Then, the image in one page is processed in order of the blocks A, B, C every band whose width corresponds to the data processing time of the block. In FIG. 5, an example in which one page is divided into four bands B1 to B4 is illustrated. But this example is given merely by way of example.

Figure 6:
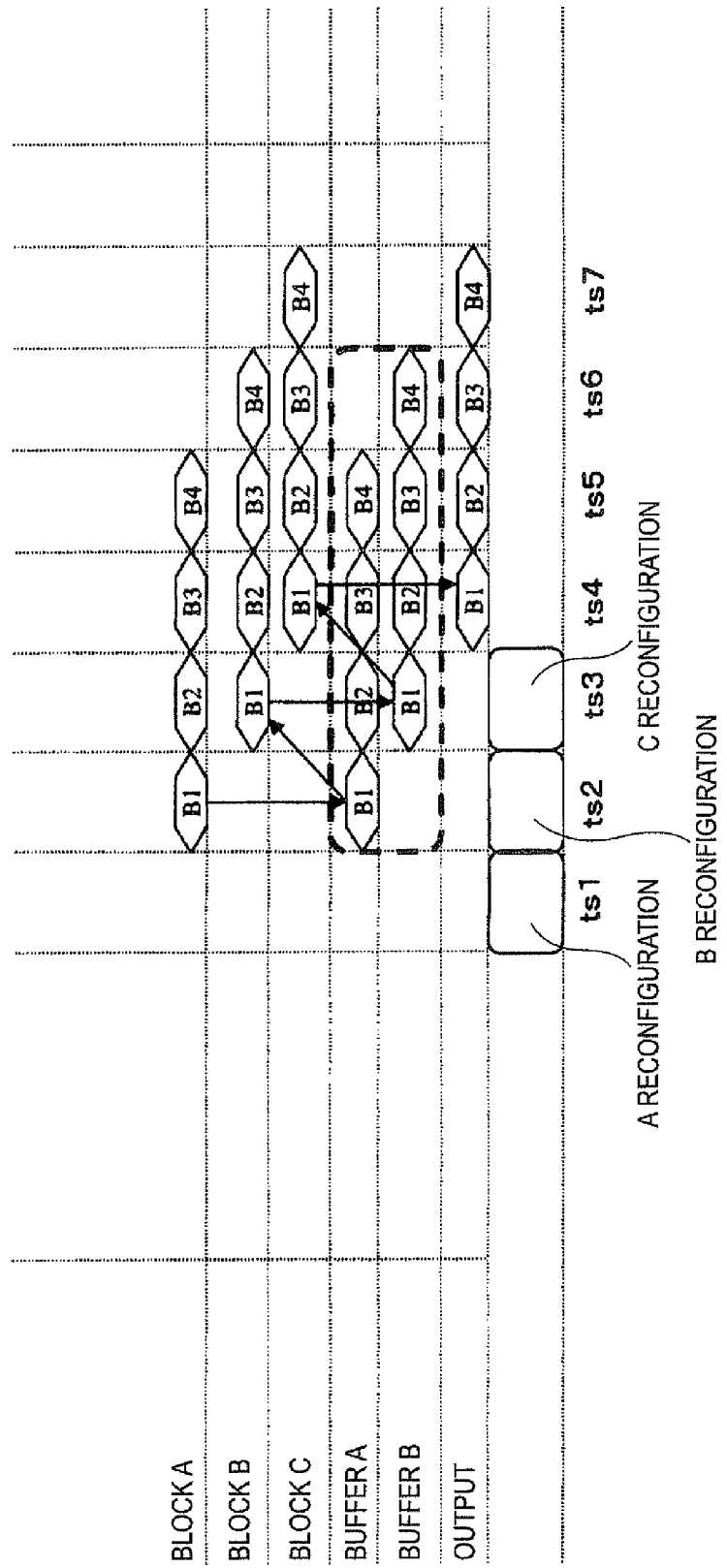
FIG. 6 is a time chart showing a change in time of states/operations of the FPGA in the exemplary embodiment.

A flow along which respective blocks A, B, C in the data processing apparatus of this exemplary embodiment processes this page every band is given as shown in FIG. 6.

More particularly, first a block A122 is reconfigurated during a time slot ts1 (a time width of this slot is equal to the reconfiguration time of the block) immediately after the start of the reconfiguration and the processing is commanded from the upper device. In a next time slot ts2, a block B124 is reconfigurated and also the reconfigurated block A processes the band B1 located at the head of page, and then the processed result is stored in the buffer A of the external memory 240. In a next time slot ts3, the block C is reconfigurated. Also, the block A processes a next band B2 and stores the processed result in the buffer area A (here the double buffer system may be employed), then the reconfigurated block B reads the processed result of the block A in the band B1 from the buffer area A and processes it, and then stores the processed result in the buffer area B. In a next time slot ts4, the block A processes a band B3 and stores the processed result in the buffer area A. Also, the block B receives the processed result of the block A in the band B2 from the buffer area A and processes it, and writes the processed result in the buffer area B. Also, the block C reads the processed result of the block B in the band B1 from the buffer area B and processes it, and outputs the processed result to the external device. Then, the pipeline processes described above are repeated, and thus the processed result in the last band B4 is output to the external device in a time slot ts7.

In the exemplary embodiment explained in the above, the transfer of the data of the processed result from the block A to the block B and from the block B to the block C is done via the external memory 240. Accordingly, as appreciated from the time charts of the buffer areas A and B in FIG. 6, the external memory 240 always executes the reading/writing operations of the data contained in two bands in the time slots ts3 to ts5. For example, in case the external memory 240 is accessed by not only the data processing apparatus in this exemplary embodiment but also other devices, a memory band that other device may use is compressed because a memory band used by the data processing apparatus is large in at least the time slots ts3 to ts5.

Figure 7:
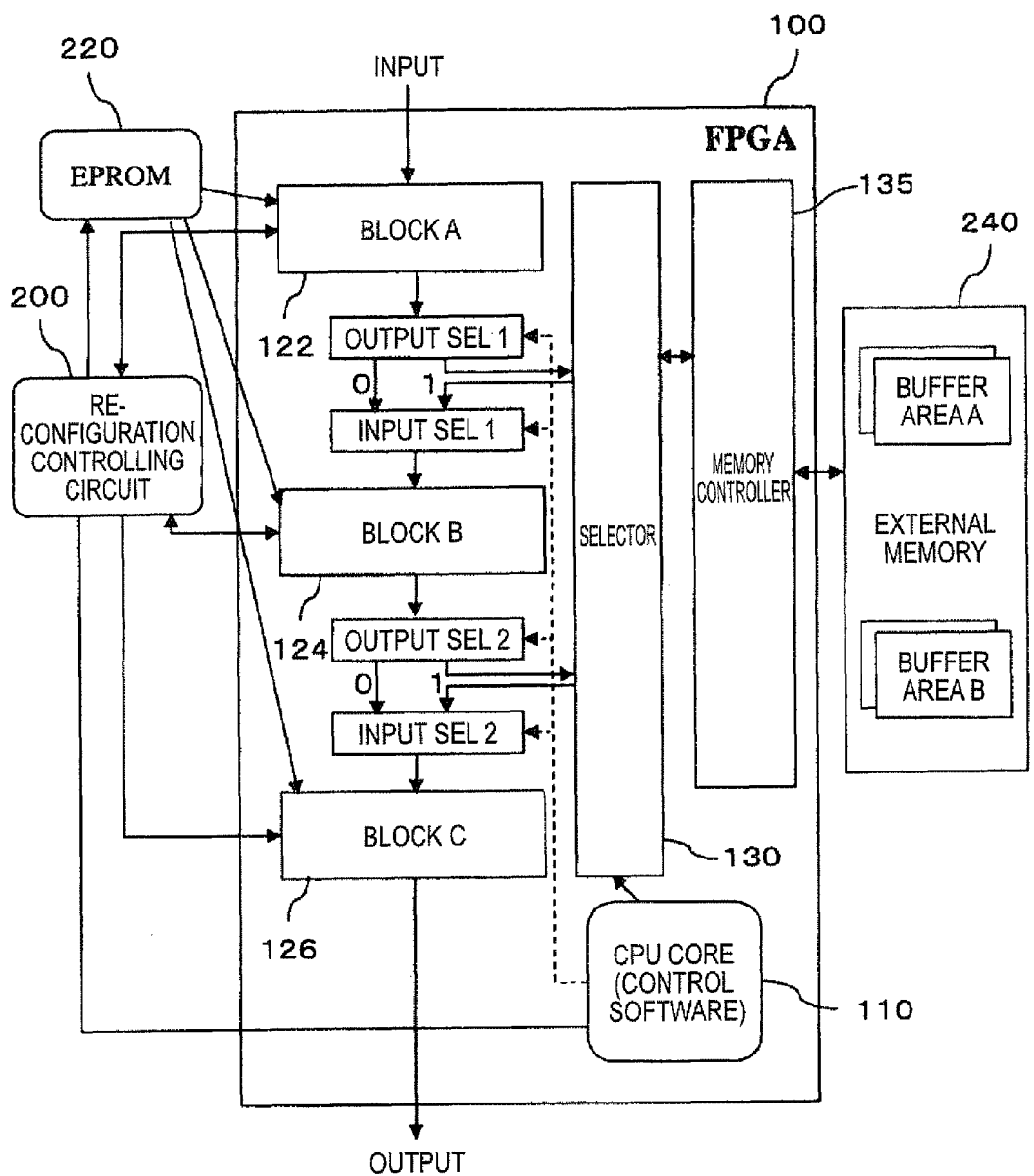
FIG. 7 is a view showing an example of a configuration of a data processing apparatus of a variation of the present invention.

Therefore, a variation in which a band of the external memory 240 used by the data processing apparatus is reduced is shown hereunder. FIG7 shows a configuration of the data processing apparatus in this variation. In FIG. 7, the same reference symbols are affixed to the constituent elements similar to those in FIG. 1, and explanation of these constituent elements will be omitted herein.

In this variation, in addition to the data paths being held via the external device 240 in the above exemplary embodiment, data paths for connecting directly the blocks are provided, and both data paths are used selectively.

For this purpose, in a configurative example in FIG. 7, an output selector (an "output SEL 1") and an input selector (an "input SEL 1") are provided between the blocks A and B in the FPGA 100, and an output selector (an "output SEL 2") and an input selector (an "input SEL 2") are provided between the blocks B and C.

The output SEL 1 is of the 1-input and 2-output type. The input is connected to the output of the block A, while one of two outputs (the "1" system in FIG. 7) is connected to the selector 130 connected to the external device 240 and also the other (the "0" system in FIG. 7) is connected to one (the "0" system in FIG. 7) of inputs of the input SEL1 to provide the direct connection to the block B. The output SEL1 selects one of outputs of two systems in response to a control signal supplied from the CPU core 110.

The input SEL 1 is of the 2-input and 1-output type. The output is connected to the input of the block B, while one of two inputs (the "1" system) is connected to the selector 130 connected to the external device 240 and also the other (the "0" system) is connected to one (the "0" system) of outputs of the output SEL1 to provide the direct connection to the block A. The input SEL1 selects one of inputs of two systems in response to the control signal supplied from the CPU core 110.

Also, the output SEL 2 and the input SEL 2 provided between the blocks B, C have the similar connection configurations similar to the output SEL 1 and the input SEL 1. Similarly, the output SEL 2 and the input SEL 2 are controlled by the CPU core 110.

In this variation, under the control of the CPU core 110 (a control software that the CPU core 110 executes), the output SEL 1 and the output SEL 2 selects the "1" system, i.e., the output on the selector 130 side as the output destination until a timing at which the reconfiguration of the block B located just in the downstream in the pipeline is completed. Also, the output SEL 1 and the output SEL 2 switch the output destination to the "0" system, i.e., the output on the input SEL1 side at a predetermined timing subsequent to the timing at which the reconfiguration of the block B is completed. Subsequently, the output SEL 1 and the output SEL 2 maintain this selected state.

Also, under the control of the CPU core 110, the input SEL1 selects the "1" system, i.e., the input on the selector 130 side as the input source in a period until the processed result of the block A stored in the buffer area A of the external memory 240 is eliminated. Also, the input SEL1 switches the input source to the "0" system, i.e., the input on the output SEL1 side at a predetermined timing subsequent to the timing at which the processing of the processed result in the buffer area A is completely ended. Subsequently, the input SEL1 maintains this selected state.

Similarly, the output SEL2 selects the "1" system, i.e., the output on the selector 130 side as the output destination until the reconfiguration of the block C is completed, and switches the output destination to the "0" system, i.e., the output on the input SEL2 side at a timing subsequent to the completion of the reconfiguration. Also, the input SEL2 selects the "1" system, i.e., the input on the selector 130 side as the input source in a period until the processed result of the block B stored in the buffer area B is eliminated, and then switches the input source to the "0" system, i.e., the input on the output SEL1 side at a subsequent timing after the processing of the data in the buffer area B is completely ended.

The output SEL1, SEL2 and the input SEL1, SEL2 are also reconfigured by using the logical blocks and the wiring resources in the FPGA 100 under the control of the reconfiguration controlling circuit 200.

Here, the reconfiguration controlling circuit 200 reconfigurates sequentially the output SEL1 and SEL2 and the input SEL1 and SEL2 on the FPGA 100 to satisfy the following conditions. That is, first the output SEL1 is reconfigurated until the block A is started (e.g., at the same time with the block A). Also, the input SEL1 is reconfigurated until the block B is started (e.g., at the same time with the block A or at the same time with the block B). Also, the output SEL2 is reconfigurated until the block B is started (e.g., at the same time with the block 8). Also, the input SEL2 is reconfigurated until the block C is started (e.g., at the same time with the block B or at the same time with the block C).

Next, an example of a transition of states/operations of respective selectors and respective blocks in the FPGA 100 in time in this variation will be explained with reference to FIG. 8 hereunder.

Figure 8:
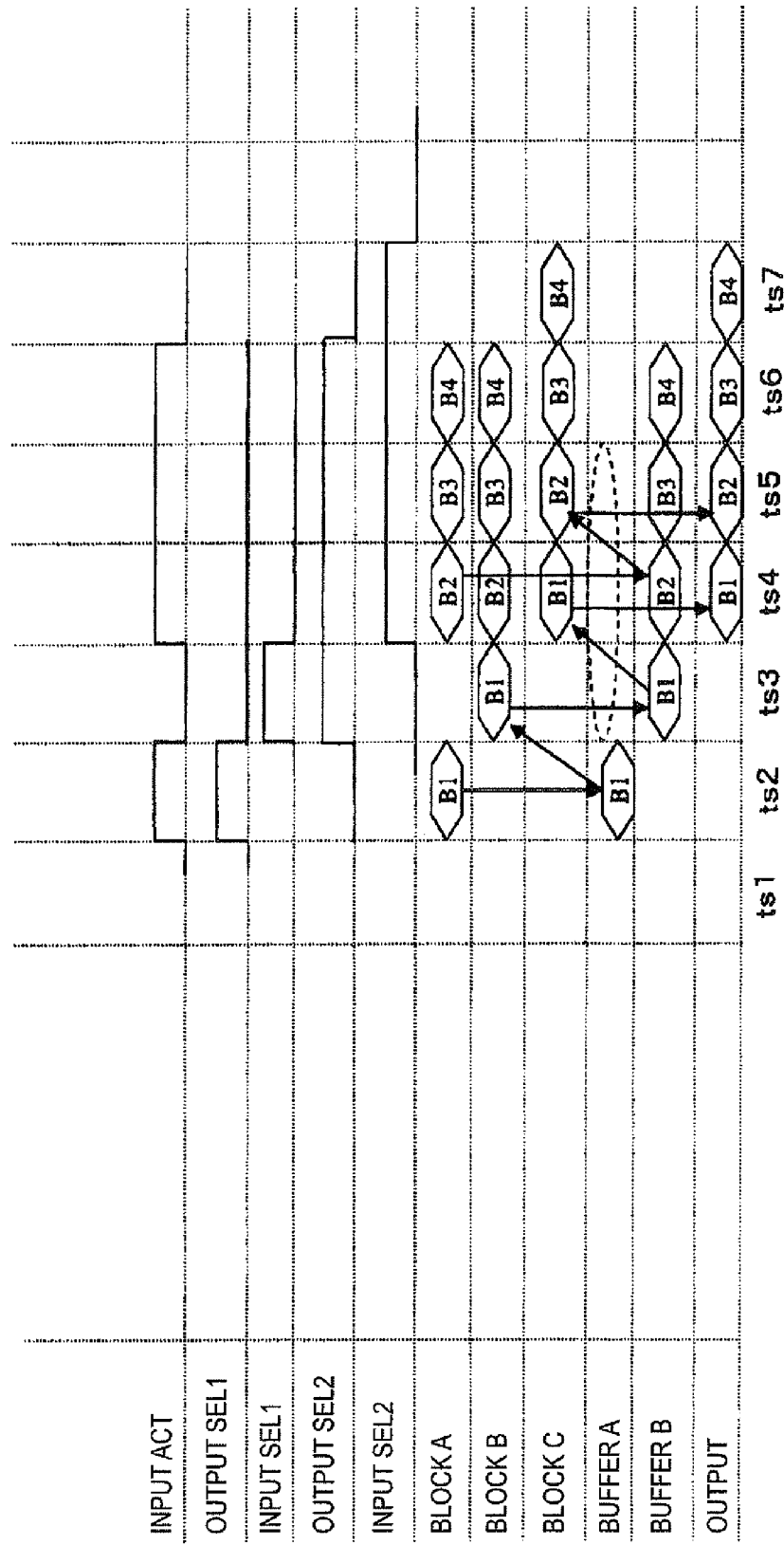
FIG. 8 is a time chart showing an example of a change of states/operations of the FPGA in time in the variation.

In FIG. 8, a signal "input ACT" is a binary control signal that enables or disables the data input into block A from the external device. The data input is allowed when this signal is at a high level, while the data input is inhibited when this signal is at a low level. A signal "output SEL1" is a control signal that controls a choice of the output destination of the selector "output SEL1". The output SEL1 selects the "1" system, i.e., the output on the selector 130 side when this signal is high, while the output SEL1 selects the "0" system, i.e., the output on the path side directly connected to the block 13 when this signal is low. A signal "input SEL 1" is a control signal that controls a choice of the input source of the selector "input SEL1". The input SEL1 selects the "1" system, i.e., the input on the selector 130 side when this signal is high, while the input SEL1 selects the "0" system, i.e., the input on the path side directly connected to the block A when this signal is low. A signal "output SEL2" and a signal "input SEL2" are similar to the above signals. These control signals are issued by the control software that the CPU core 110 executes.

In the example in FIG. 8, the input ACT signal is low in the period ts1 in which the reconfiguration of the block A is carried out, and is low in the period ts2 in which the reconfiguration of the block 13 is carried out after the reconfiguration is completed. The input ACT signal goes back to a low level in the next time slot ts3 in which the reconfiguration of the block C is carried out, and then goes to a high level after the time slot ts4 in which the reconfiguration of the block C is completed. According to such signal, first the data in the band B1 (see FIG. 5) is input into the block A in the time slot ts2 after the block A is reconfigurated, and then the data input is stopped in the next time slot ts3. Then, the data input is restarted in the next time slot ts4, and then the data in the band B2, B3, B4 are input into the block A in the time slots ts4, ts5, ts6 respectively.

Also, the output SEL1 signal goes to a high level only in the time slot ts2. That is, the output SEL1 signal goes to a high level at a timing at which the reconfiguration of the block A is completed, and goes to a low level at a timing at which the reconfiguration of the next block B is completed. After this, a low state of the output SEL1 signal is kept. Also, the input SEL1 signal goes to a high level only in the time slot ts3. That is, the input SEL1 signal goes to a high level at a timing at which the reconfiguration of the block B is completed, and goes to a low level at a timing at which the reconfiguration of the next block C is completed, i.e., a timing at which the block B completes the processing of the data in the band B1. After this, a low state of the input SEL1 signal is kept. According to such control signal, the transfer of the data in the first band B1 is carried out between the blocks A, B via the buffer area A of the external memory 240, and the data in the band B2 and thereafter are supplied directly from the block A to the block 13 without intervention of the external memory 240.

Also, in the example in FIG. 8, the output SEL2 signal is still kept at a high level until the block B terminates the outputting of the data in all bands B1 to B4 after the block B is started. In answer to this situation, the input SEL2 signal is still kept at a high level until the block C terminates the outputting of the data in all bands B1 to B4 after the block C is started. According to such control signal, the transfer of the data from the block B to the block C is carried out totally via the buffer area B of the external memory 240 not to use the directly coupled path at all.

Under this control, the data in the band B1 is transferred from the block A to the block B via the buffer area A, then is transferred from the block B to the block C via the buffer area B, and then is output finally from the block C to the external device. In contrast, the data in the band B2 is input into the block A from the external device and processed in the time slot ts4, and also the processed result is input directly to the block B and processed. Then, the processed result is stored in the buffer area B. Then, the processed result of the band B2 held in the buffer area B is processed by the block C in the next time slot ts5, and is output to the external device. Flows of the processing in the bands B3 and B4 are similar to that in the band B2.

In the control example in FIG. 8, in comparison with the example in FIG. 6, a memory band that is used to write the data of the processed result of the block A into the buffer area A becomes empty in the time slot Ts3 and thereafter, and a memory band that the block B uses to read the data from the buffer area A becomes empty in the time slot Ts4 and thereafter.

Also, in the example in FIG. 8, actually the output SEL2 and the input SEL2 between the blocks B, C do not operate (the selector 130 side is always selected). Therefore, in this example, there is no necessity that the output SEL2 and the input SEL2 should be provided. Similarly, such a configurative example may be considered that only the output SEL2 and the input SEL2 between the blocks B, C are provided and also the output SELL and the input SEL1 between the blocks A, B are not provided.

Next, another example of the control of the data path in the variation in FIG. 7 will be explained with reference to FIG. 9 will be explained hereunder. In this example, the input ACT signal is high in the time slots ts2, ts4, and ts6 and the subsequent time slots, and is low in the time slots ts3, ts5.

The output SELL signal and the input SEL1 signal are similar to those in the example in FIG. 8. But the output SEL2 signal and the input SEL2 signal are different from those in the example in FIG. 8 (substantially always high), and are switched to a low level at a shortest timing. That is, the output SEL2 signal is switched to a low level at a trailing edge of the time slot ts4, i.e., at a timing at which the writing of the processed result in the band 132 from the block B to the buffer area 13 is terminated. Also, the input SEL2 signal is switched to a low level at a trailing edge of the time slot ts5, i.e., at a timing at which the reading of the processed result in the band 132 from the buffer area B to the block C is terminated.

Under such control, the data in the bands B3 and B4 are processes in order of the blocks A, B, C in the time slots ts6 and ts7 without intervention of the external memory 240 respectively, and are output to the external device.

Figure 9:
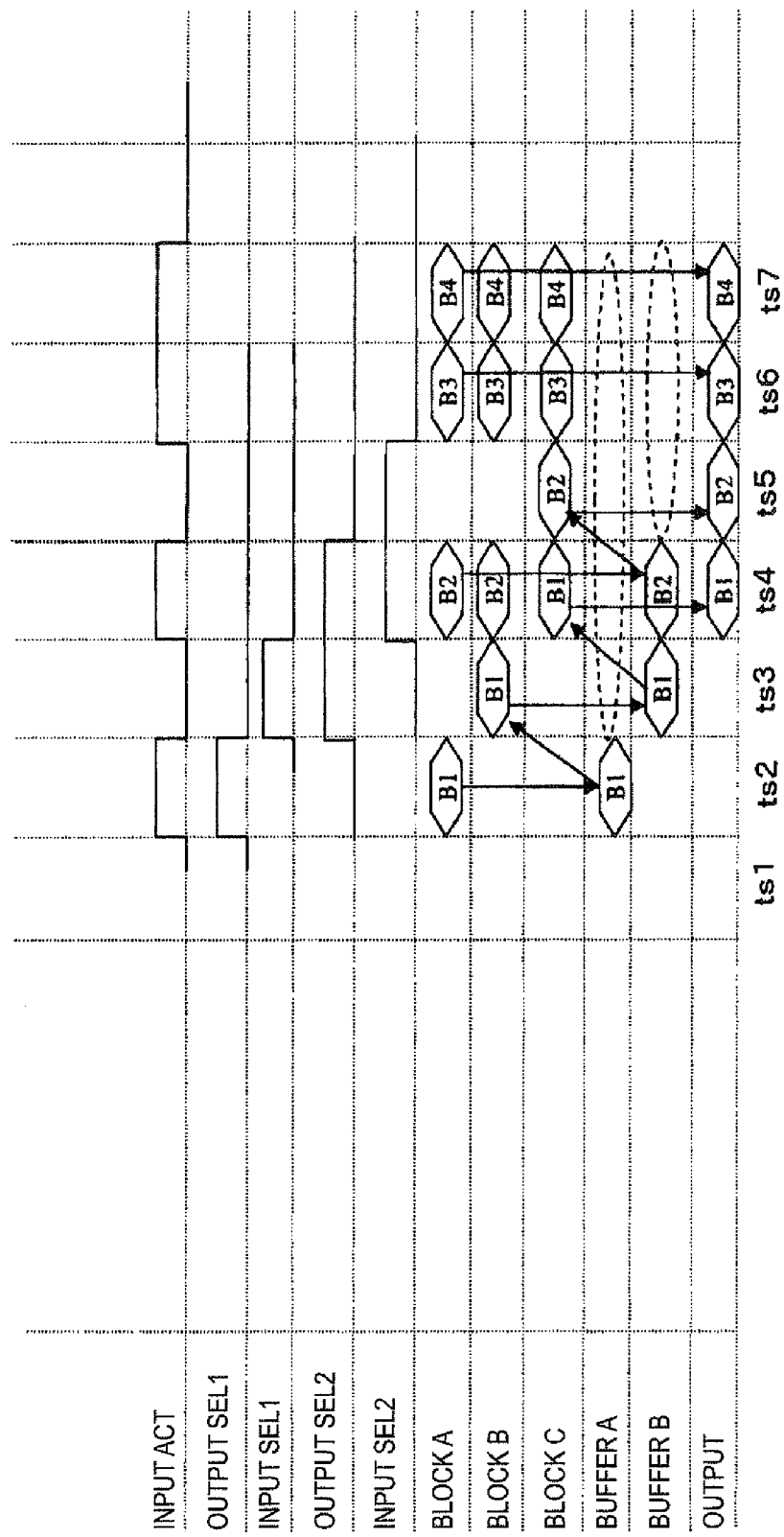
FIG. 9 is a time chart showing another example of a change of states/operations of the FPGA in time in the variation.

According to the control in FIG. 9, a memory band that is used to read/write the data in the bands B3 and B4 from/into the buffer area A becomes empty.

In the above, the example of control under which the blocks A, B, C among one whole circuit α, which may exist simultaneously on the FPGA 100, are reconfigurated and started is explained. However, the control of this exemplary embodiment may be applied to the case where a plurality of whole circuits are present and these circuits are written sequentially into the FPGA 100 to execute the pipeline process. Here, the whole circuits occupy the positions that superposed with each other on the FPGA 100, and thus these circuits may not simultaneously present on the FPGA 100. In this event, the FPGA 100 is shared in time (time sharing) with a plurality of whole circuits to constitute the larger pipeline, and also a plurality of blocks constitute simultaneously the pipeline in a space on the FPGA 100 in individual whole circuits.

Figure 10:
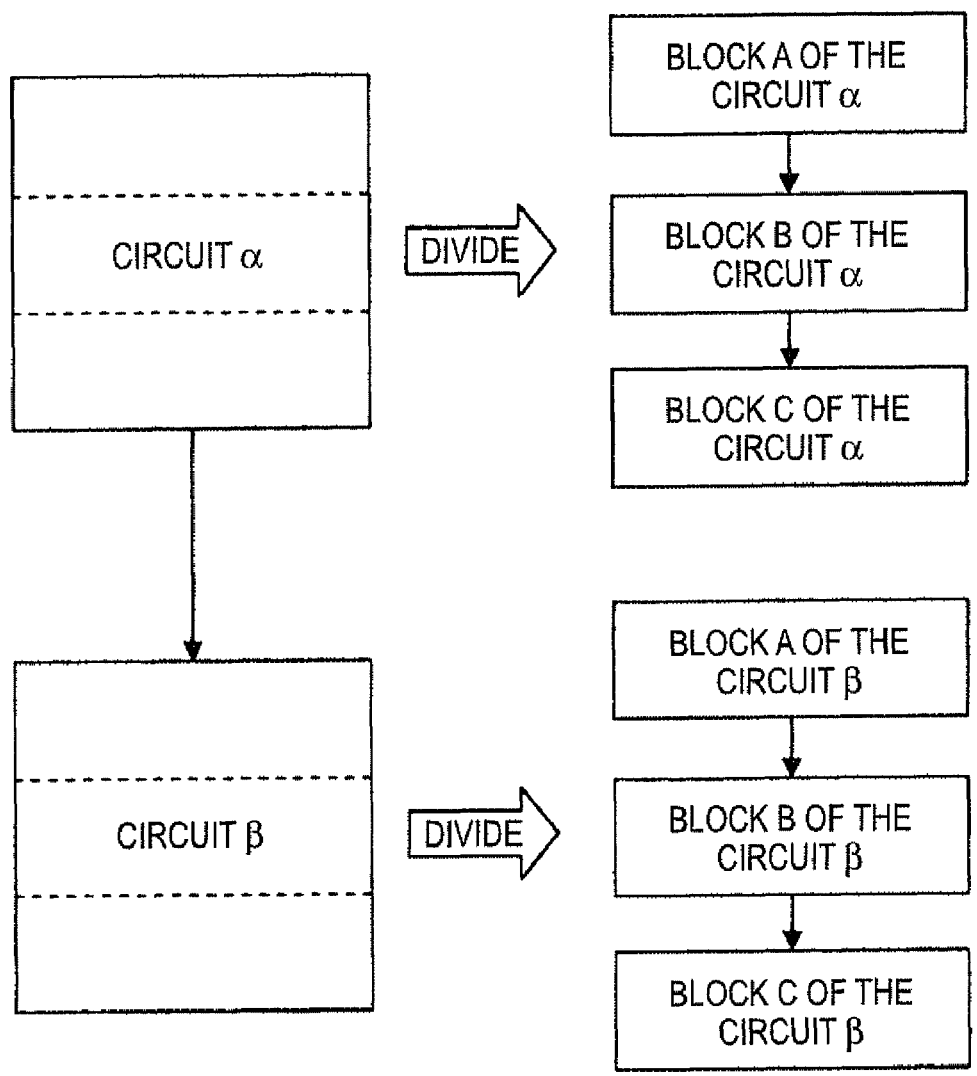
FIG. 10 is a view showing an example in which two whole circuits are written sequentially into the FPGA to execute a pipeline process.

For example, in an example shown in FIG. 10, first the whole circuit α is reconfigurated on the FPGA 100, and the whole circuit β that applies the further processing to the result of the processing is reconfigurated on the FPGA 100 after the processing in the whole circuit α is terminated. Here, the whole circuits α and β are divided into a plurality of blocks A, B, C constituting the pipeline respectively, like the above exemplary embodiment. Then, when the whole circuits α and β are reconfigurated and operated respectively, the reconfiguration controlling circuit 200 reconfigurates and starts sequentially the blocks one by one in compliance with the approach in the above exemplary embodiment or the variation.

In this example, the whole circuit α is divided into a plurality of blocks, and these blocks constitute the pipeline. Therefore, even after the data processing of the block A located at the head of the pipeline is terminated, there still exists such a period in which the later block is executing the data processing. Because the reconfiguration of the block located at the head of the pipeline of the next circuit β is started within this period, a timing at which the reconfiguration of the whole circuit β is completed may be sped up in contrast to the related art.

In other words, in the system in the related art, as shown in FIG. 11A, all blocks A, B, C of the whole circuit α are reconfigurated in the time slots ts1 to ts3, and then these blocks A, B, C execute the data processing (in this example, the processing of the data corresponding to three bands) in the time slots ts4 to ts6. Then, when the processing is terminated, the blocks A, B, C of the whole circuit β are reconfigurated in the time slots ts7 to ts9, and then the blocks A, B, C execute the data processing in the time slots ts10 to ts12. In the example in FIG. 11A, it is assumed that, in order to avoid a complicatedness, times required for the reconfiguration of the whole circuits α and β are set equal to each other. In this event, because the reconfiguration time depends on individual circuit scales, sometimes such reconfiguration time does not become equal.

In contrast, in the configurations in the exemplary embodiment and the variation, as shown in FIG. 11B, the block A located at the head of the whole circuit α is reconfigurated and started in the time slot ts1, and then the processing of the data in the time slot ts4 is terminated. The block A is not needed in the time slot ts5 and thereafter. On the contrary, the block C at the end of the whole circuit α also executes the data processing in the time slots ts5 and ts6. In this situation, the reconfiguration controlling circuit 200 starts the reconfiguration of the block A at the head of the whole circuit β in the time slot ts5 or ts6 (in FIG. 11B, the case where the block A is reconfigurated in the time slot ts5 is illustrated). Also, the processed result of the head band of the page given by the whole circuit α may be obtained in the time slot ts4, and already exists at a point of time when the reconfiguration of the block A is completed. Therefore, the block A may be started immediately after the completion of the reconfiguration. Also, in the example in FIG. 11B, the reconfiguration of the block B of the whole circuit is done before the processing of the block C of the whole circuit α is terminated. In this manner, the part that has already done the data processing is rewritten by the next whole circuit while a part of the preceding whole circuit is still executes the data processing, and thus a time required for the processing executed throughout the whole circuits α and β may be shortened.

In order to make the reconfiguration control described above possible, the block A of the whole circuit β may be designed as the circuit that occupies the area not to interfere with the blocks B and C of the whole circuit α mutually. Also, the block B of the whole circuit β may be designed as the circuit that occupies the area not to interfere with the block C of the whole circuit α and not to interfere with the block A of the whole circuit β.

Here, when the processing is advanced while rewriting the FPGA 100 into the whole circuits α and β alternately, the reconfiguration of the block A of the whole circuit α may be executed in the time slot ts9 in FIG. 11B. Also, the case where two whole circuits constitute the pipeline is illustrated herein. It should be understood that the reconfiguration control is applicable to the case where three whole circuits or more constitute the pipeline.

In the exemplary embodiment and the variation explained as above, the FPGA 100 is illustrated as an example of the reconfiguration enabling circuit. In this case, the circuit of the other type/system (e.g., PLD or CPLD (Complex PLD)) may be employed as the reconfiguration enabling circuit provided to the data processing apparatus.

Next, an example of the control that is applied to band-divide the data of the processed object so as to meet a block division of the whole circuit and supply the divided data will be explained hereunder.

Figure 12:
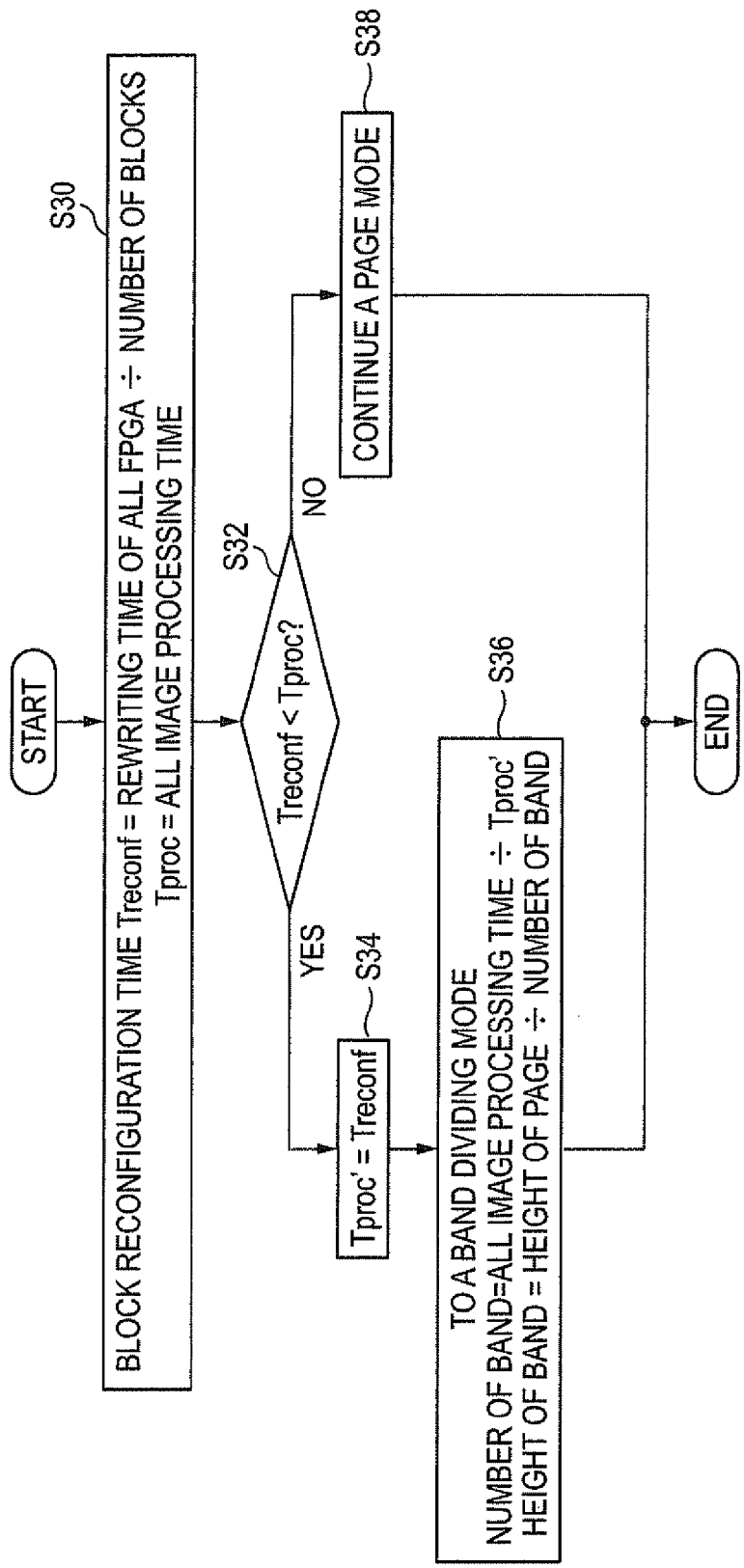
FIG. 12 is a flowchart showing an example of the control that a band division is applied to make data of the processed object coincide with a block division of the whole circuit.

In this example, the CPU core 110 out of the apparatus configuration illustrated in FIG. 1 or FIG. 7 executes the processing in compliance with the procedures in FIG. 12. The procedures in FIG. 12 show an example of the case where the whole circuit used to execute the processing of the page image for the printing is reconfigurated on the FPGA 100.

First, in the procedure, the CPU core 110 acquires values of a block reconfiguration time Treconf and an all image processing time Tproc from a set value storing memory device provided to the data processing apparatus. For this purpose, the user such as the designer who designs the circuit used to write the data into the data processing apparatus, or the like should set in advance the values of the block reconfiguration time Treconf and all image processing time Tproc (or information to derive the values) in the data processing apparatus.

Here, the term "block reconfiguration time Treconf" denotes a time required to reconfigurate one block. For example, this value is a resultant value when all writing time of the FPGA 100, i.e., a time required to reconfigurate the whole circuit α is divided by the number of blocks given when the whole circuit α is divided into the blocks. In other words, a reconfiguration time of one block is obtained by dividing the whole circuit α by the number of blocks under the assumption that circuit scales of respective blocks are set substantially equal mutually. Also, for example, the designer applied in advance the design herein to divide the whole circuit α into plural blocks with a substantially equal circuit scale to constitute the pipelines. Therefore, the number of blocks may be obtained from the design information.

In this case, in this block dividing design, the end of the data processing is accelerated as described above if the whole circuit is divided into the blocks as finely as possible, i.e., into as a larger number as possible of blocks as far as the given conditions permit. For example, the maximum number of data streams that may be input/output into/from the data processing apparatus may be calculated from the relation between a memory bandwidth, which is assigned for the data processing apparatus to hold a communication with the external memory, and a processing speed, which corresponds to an internal frequency of the FPGA 100. Because the blocks are the input blocks and the output blocks, the half number of such maximum number gives the maximum number of blocks under the given conditions. For example, when a memory bandwidth is 4 GB/s and an internal frequency is 200 MHz (i.e., a processing speed is 200 MB/s), the number of streams is 20 at a maximum, i.e., the maximum number of blocks becomes 10. The designer may apply the design to divide the whole circuit α equally into the maximum number of blocks.

With the above, the block reconfiguration time Treconf may be derived from a time required for the writing of the whole circuit α and the number of blocks, for example.

Also, the term "all image processing time Tproc" denotes a time required for the whole circuit α to process all data of the processed object (in this example, the whole image data for one page). An amount of data for one page as the object is already known at a point of time when the designer designed the whole circuit α. Therefore, the value of the block reconfiguration time Treconf is made clear at this point of time.

In this manner, in S30, the user such as the designer, or the like sets both the block reconfiguration time Treconf (or the rewriting time and the number of blocks of the whole FPGA as the base of Treconf) and all image processing time Tproc. Here, these settings are input into the data processing apparatus once. Then, when the data processing apparatus is started to execute the data processing, the control software may execute the following processes by reading the set values.

The CPU core 110 of the data processing apparatus that executes the control software decides whether or not a band division of the page image data as the processed object should be applied, and a size of the band when the band division is applied, based on these set values.

More specifically, the CPU core 110 compares the block reconfiguration time Treconf with all image processing time Tproc (S32). If the former is shorter than the latter (i.e., the decision result in S32 is Yes), the CPU core 110 sets the value of the image processing time Tproc' per one block as the block reconfiguration time Treconf (S34). Then, the process goes to a mode in which the page image data as the processed object is divided into the bands (S36). In this mode, the resultant value obtained by dividing all image processing time Tproc acquired in S30 by the image processing time Tproc' per one block is set as the number of bands when the band division is applied to all image data as the processed object. Also, a height of each band is set to the value obtained by dividing a height of the page by the number of band. Then, the control software divides the page image data as the processed object into band units based on the number of bands and a height of the band, and then inputs sequentially the band units into (the head block of) the FPGA 100 band by band from the head band. More particularly, the CPU core 110 transfers the head address of the band and the band size to the DMA (Direct Memory Access) controller (not shown) provided to the data processing apparatus, for example, then asks the DMA controller to transfer them to the input address of the head block of the FPGA 100, and then asks the DMA controller to transfer them to the next band every time when the transfer of the data for one band is terminated subsequently.

Also, if the decision result in step S32 is No, i.e., if Treconf≧Tproc, the CPU core 110 does not apply the band division to the page image data as the processed object, and inputs the value into (the head block of) the FPGA 100 as it is (S38).

Figure 13:
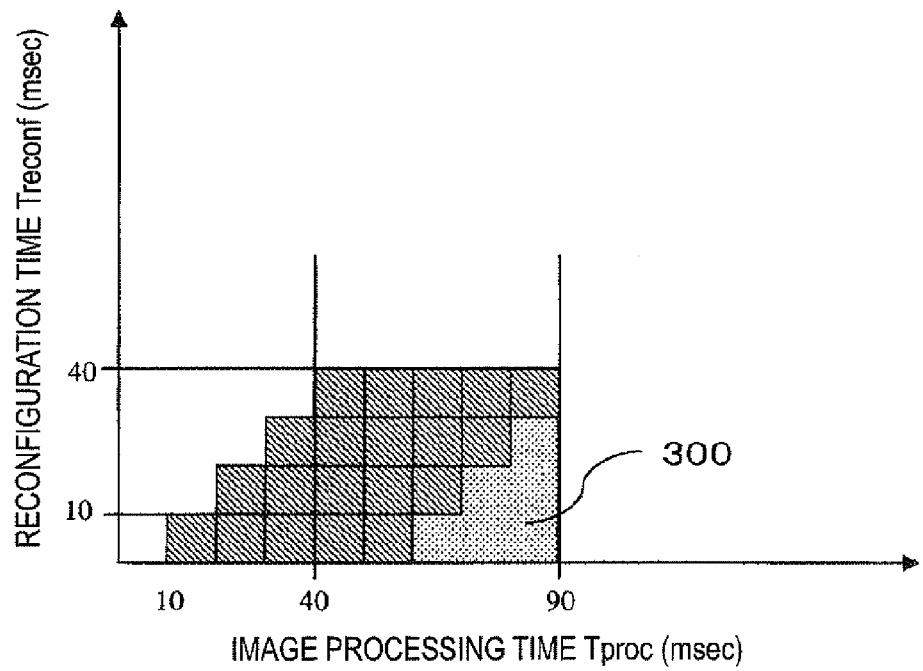
FIG. 13 is a view showing an example of a time relation between a reconfiguration and an image processing when a block reconfiguration time is shorter than a whole image processing time.

According to such control, if the block reconfiguration time Treconf is shorter than all image processing time Tproc, the page image as the processed object is divided into the band units and is processed. For example, it is assumed that the reconfiguration time of the whole circuit α is set to 40 ms, the number of blocks is set to 4, and all image processing time required for the whole circuit α to process the page image is set to 50 ms. In the system in the related art to reconfigurate the whole circuit α collectively, as shown in FIG. 13, the rewriting of the FOGA 100 is executed for 40 ms from a start point of time, and the whole page image is processed for a time from 40 ms to 90 ms. In FIG. 13, this area is indicated by respective rectangles that are shaded by a fine dot pattern (where a part of this area is hidden by obliquely hatched squares as the result of band division). In contrast, the progress of the processing when the block division and in turn the band division are applied to the whole circuit α according to the procedures in FIG. 12 is indicated by the oblique hatching in FIG. 13. In this case, the head block is reconfigurated for 10 ms from the start point of time, and then one band at the head of page is processed up to 20 ms in the head block. Since the reconfiguration of the second block is completed at a point of time when this processing is ended, the processed result of the head band in the head block is input into the second block, and is processed up to 30 ms. In parallel with this process, the head block processes the second band for a while from 20 ms to 30 ms. In this manner, 5 bands constituting one page are pipeline-processed by a group of blocks. In the example in FIG. 13, the system in the present exemplary embodiment is capable of finishing the processing more quickly than the system in the related art by a difference in line delay shown in FIG. 4. Also, both a time indicated by a part 300 as a difference between the system in the related art and the case of the block division/the band division, and an empty area on the FPGA 100 may be utilized to reconfigurate or operate other circuits.

Figure 14:
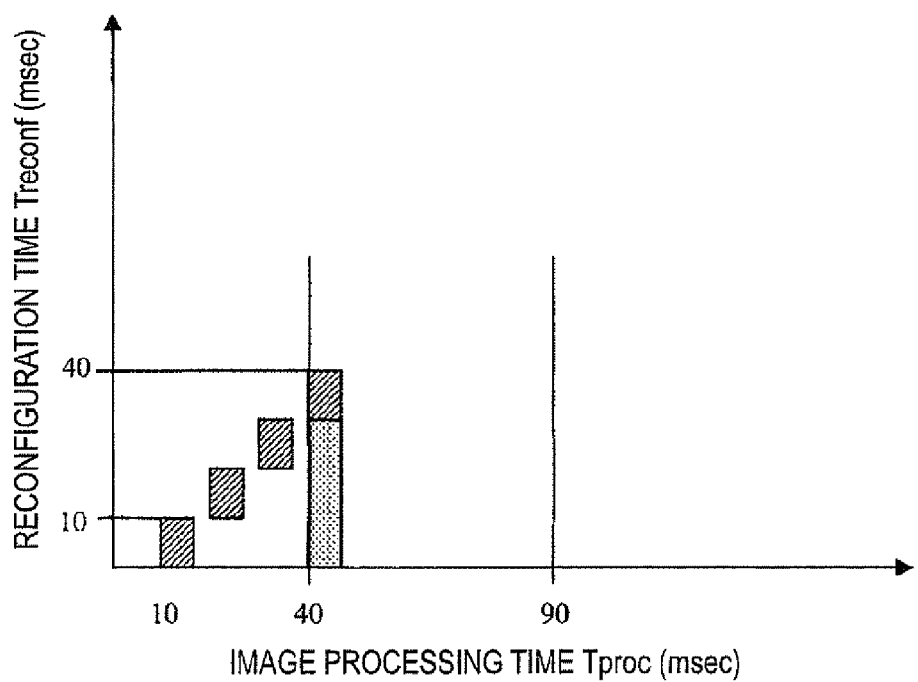
FIG. 14 is a view showing an example of a time relation between a reconfiguration and an image processing when a block reconfiguration time is longer than a whole image processing time.

Also, if the block reconfiguration time Treconf is in excess of all image processing time Tproc, in the system in the related art in an example shown in FIG. 14, the whole circuit α is operated from a time of 40 ms at which the reconfiguration of the whole circuit α is completed, and the whole page is processed within 6 ms. On the contrary, in the system in the present exemplary embodiment, the head block is reconfigurated by 10 ms, then the head block processes the whole page by 6 ms, then the second block is reconfigurated for a while from 10 ms to 20 ms, and then the processed result of the head block is processed by 6 ms. When the above processes are repeated, the data of the whole page are processed by the pipeline processing in respective blocks. In this case, the processing may also be ended more quickly than the related art by a difference in the line delay shown in FIG. 14. Also, the blocks whose processing is ended may be utilized when these blocks are rewritten into other circuits, or the like.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments are chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A data processing apparatus, comprising:
a reconfigurable circuit capable of reconfigurating partially a circuit configuration: and
a reconfiguration controlling unit that controls a reconfiguration of the circuit configuration of the reconfigurable circuit;
wherein the reconfiguration controlling unit reconfigurates a plurality of partial circuits, which constitute one pipeline and are reconfigurated simultaneously on the reconfigurable circuit, on the reconfigurable circuit in sequence from a head partial circuit of the pipeline, and starts sequentially the reconfigurated partial circuits from a head,
the plurality of partial circuits include first and second partial circuits which are reconfigured on the reconfigurable circuit in sequence
the second partial circuit is reconfigured after the first partial circuit is reconfigured, and
the second partial circuit is reconfigure while the first partial circuit is started.

2. The data processing apparatus according to claim 1,
wherein the reconfiguration controlling unit reconfigurates a first input circuit for inputting data, which the first partial circuit located just before the second partial circuit in the pipeline outputs and which are stored in a memory when the second partial circuit is reconfigurated on the reconfigurable circuit, into the second partial circuit from the memory, and a first output circuit for storing the data being output from the second partial circuit into the memory.

3. The data processing apparatus according to claim 1,
wherein the plurality of partial circuits include third partial circuit which are reconfigured on the reconfigurable circuit after the second partial circuit is reconfigured,
the reconfiguration controlling unit reconfigurates a second output circuit for outputting the data being output from the second partial circuit to the third partial circuit in the pipeline, and an output selecting circuit for selecting selectively the first output circuit and the second output circuit, and
the data processing apparatus further comprising:
a selection controlling unit that applies a control such that the output selecting circuit selects the first output circuit before the third partial circuit is reconfigurated on the reconfigurable circuit, and that applies a control such that the output selecting circuit selects the second output circuit after the third partial circuit is reconfigurated on the reconfigurable circuit.

4. The data processing apparatus according to claim 1,
wherein the reconfiguration controlling unit contains plural sets of circuit information indicating sets consisting of a plurality of partial circuits that constitute one pipeline and are reconfigurable simultaneously on the reconfigurable circuit,
the reconfiguration controlling unit applies a set sequential reconfigurating control such that a plurality of partial circuits of a first set are reconfigurated according to a sequence in the pipeline, based on the circuit information of the first set out of the plural sets and are started, and a plurality of partial circuits of a second set are reconfigurated according to a sequence in the pipeline, based on the circuit information of the second set out of the plural sets after the data processing executed by a plurality of partial circuits of the first set,
a second head partial circuit located at a head of the second set in the pipeline is designed such that the second head partial circuit is reconfigurated in an area in which the second head partial circuit does not interfere with a first head partial circuit located at a head of the first set in the pipeline, and
the set sequential reconfigurating control starts a reconfiguration of the second head partial circuit located at the head of the pipeline out of a plurality of partial circuits in the second set after the first head partial circuit located at the head of the first set in the pipeline completes a data processing and before other partial circuit of the first set in the pipeline completes the data processing.

5. The data processing apparatus according to claim 1,
wherein a partial circuit reconfigurating required to reconfigurate each partial circuit is equal mutually,
the data processing apparatus further comprising:
a dividing unit that divides the data as the processed object into plural pieces of the plurality of partial circuits and inputs partial data as a divided result into the partial circuit located at the head of the plurality of partial circuits respectively when a data processing time required to process the data as the processed object by the pipeline consisting of a plurality of partial circuits is longer than the partial circuit reconfigurating time.

* * * * *